US007705601B2

(12) United States Patent
Zhou et al.

(10) Patent No.: US 7,705,601 B2
(45) Date of Patent: Apr. 27, 2010

(54) METHOD AND APPARATUS FOR MONITORING WELLNESS OF CONTACTORS AND STARTERS

(75) Inventors: Xin Zhou, Wexford, PA (US); Jan Walker, Franklin, WI (US)

(73) Assignee: Eaton Corporation, Cleveland, OH (US)

(*) Notice: Subject to any disclaimer, the term of this patent is extended or adjusted under 35 U.S.C. 154(b) by 533 days.

(21) Appl. No.: 11/533,881

(22) Filed: Sep. 21, 2006

(65) Prior Publication Data

US 2008/0074215 A1 Mar. 27, 2008

(51) Int. Cl.
*G01R 31/27* (2006.01)

(52) U.S. Cl. ....................................... 324/424; 324/415

(58) Field of Classification Search ......... 324/422-424, 324/415; 335/132

See application file for complete search history.

(56) References Cited

U.S. PATENT DOCUMENTS 3,492,565 A * 1/1970 Harman et al. .............. 324/423
5,163,175 A * 11/1992 Mori et al. .................. 335/132
5,204,633 A 4/1993 Ahladas et al.
5,483,214 A 1/1996 Perreira et al.
5,631,614 A * 5/1997 Goodman et al. ........... 335/132
5,754,387 A 5/1998 Tennies et al.
5,774,323 A 6/1998 Innes et al.
5,914,663 A * 6/1999 Whitehead .................. 340/638
6,064,289 A * 5/2000 Wieloch et al. ............. 335/132
2001/0019573 A1* 9/2001 Dougherty et al. ............. 374/4

OTHER PUBLICATIONS

Garzon, R.D., High Voltage Circuit Breakers: Design and Applications, 2nd edition, 2002, pp. 398-407, Marcel Dekker Inc., New York.

* cited by examiner

*Primary Examiner*—Vincent Q Nguyen
(74) *Attorney, Agent, or Firm*—Ziolkowski Patent Solutions Group, SC

(57) ABSTRACT

A system and method for monitoring the remaining useable life, or "wellness," of a contactor or motor starter, and for predicting impending faults of such a device, is disclosed. By monitoring actuating coil current, actuating coil voltage, line current, and/or line voltage, the present invention can calculate wellness metrics which, when compared to threshold values, may be used as indicators of remaining life and/or imminent failures. The invention also provides non-mechanical positive indications of proper closures and openings of contacts for safety interlocking.

39 Claims, 6 Drawing Sheets

METHOD AND APPARATUS FOR MONITORING WELLNESS OF CONTACTORS AND STARTERS

BACKGROUND OF THE INVENTION

The present invention relates generally to electrical switching devices, and more particularly, to a method and apparatus for monitoring the wellness of contactors and motor starters, especially electromagnetic contactors and motor starters. The present invention measures various currents and voltages in one or both of the switched line and the actuating coil to monitor performance and determine indications of impending faults of the device.

Contactors are generally used in motor starter applications to switch on/off a load as well as to protect a load, such as a motor, or other electrical devices from current overloading. As such, a typical contactor has three contact assemblies—a contact assembly for each phase or pole of a three-phase electrical device. Each contact assembly, in turn, includes a pair of stationary contacts and a pair of moveable contacts. One stationary contact will be a line side contact and the other stationary contact will be a load side contact. The moveable contacts are controlled by an actuating assembly comprising a contact carrier and an armature magnet assembly which is energized by a coil to move the moveable contacts to form a bridge between the stationary contacts. When the moveable contacts are engaged with both stationary contacts, current is allowed to travel from the power source or line to the load or electrical device. When the moveable contact is separated from the stationary contacts, an open circuit is created and the line and load are electrically isolated from one another.

Each contact assembly, and each set of moveable and stationary contacts thereof, corresponds to a pole or phase of the same three phase input. Thus, in some contactors, the three pairs of moveable contacts are all moved between open and closed positions in unison. Other contactors, however, provide for independent or timed control of each pair of moveable contacts, such as in systems that use so-called "Point-on-Wave" switching. In addition, many contactors utilize variations intended to render them more tolerable or more sensitive to current overloads, such as contacts that automatically blow open upon an overload before an open command is received. The development of these alternatives illustrates a general recognition in the art that, despite their relative durability, all contactors have a finite useable life. Component wear, contact surface erosion, friction, jam, contact welding, arc-generated debris, and other factors limit the length of time and/or number of operations through which a contactor may be used.

Since contactors and motor starters are important components of both automation and control systems, monitoring their remaining useable life, or "wellness," to predict impending faults before occurrence is essential. Un-predicted failures of contactors not only cause costly work stoppages, but also can cause damage to the load and other related systems and equipment. In contrast, over-cautious approaches to contactor monitoring and replacement increase maintenance costs and slow or delay usage of the motor/load.

Currently, most methods for estimating the working life of contactors rely upon the manufacturer's life test data or guidelines. That is, most commercially available contactors have a designated number of operations or cycles after which the manufacturer recommends replacement to avoid failure in use. Thus, many systems and methods for predicting failure simply count the number of operations that a contactor completes. However, each contactor will not necessarily operate for the same number of cycles before failure. And, the causes of failure vary among contactors as well as the conditions which lead to possible failure issues. How a contactor is operated, the conditions under which it is used, and the characteristics of the environment in which it is used cause even more variation in the number of operations a contactor might undergo before failure. Therefore, to be useful, counting methods must be overly cautious in setting replacement schedules, or risk contactor failures while in use.

Other approaches for monitoring contactors have been centered on determining whether a connection between the movable and stationary contacts was actually made properly. Thus, some systems have compared actuating coil current to reference values to determine whether contacts have fully closed. Similar systems have measured the impedance of the actuating coil by monitoring the decay rate of current therethrough during a period when a supply regulator is turned off. Since impedance will vary appreciably depending on whether the contacts are fully open or closed, the state of the contacts can be determined. More simplistic methods of monitoring contactors have involved the use of simple mechanical translations of the position of the contacts, whether open or closed. Other approaches use optical devices to detect the presence or brightness of arc emissions indicating that a failure has occurred. However, such approaches are not believed to have the ability to reliably predict impending failures, only to detect existing failures.

Systems similar to those described above are also used for safety interlocking. That is, an additional set of contacts are coupled to the primary moveable and stationary contacts such that they engage in a closed position when the primary contacts engage and separate when the primary contacts separate. These additional sets of contacts are known as interlocks or mirror contacts. The drawback to such a method of ensuring proper contact closure is that only a rough mechanical translation of contact closure is available. Thus, the interlock contacts are just as susceptible to jam, friction, wear, erosion, and other problems as are the primary contacts. Also, even when working properly, the interlocks provide limited information—whether the contacts are properly closed. In contrast, a system which predictively monitors currents and/or voltages of the electromagnetic contactor itself can provide more data on contact movement and can provide such data throughout a complete operating cycle (initiation through coil operation and current flow to contact opening).

Drawbacks of the above methods are that they cannot accurately predict failures (they detect failures), they require additional costly hardware, they require add-ons that are bulky and not durable, they use components susceptible to damage from contact arcing, they waste contacts which have significant remaining life, and worst, they are unreliable for indicating contactor wellness and predicting impending faults.

It would therefore be desirable to have a system and method capable of accurately monitoring the remaining useable life of a contactor and impending faults thereof. Preferably, such system should not rely upon manufacturer recommended operation counts and should predict rather than merely detect failures. In addition, it would be desirable if such a system could also perform safety interlock or mirror contact functions.

BRIEF DESCRIPTION OF THE INVENTION

The present invention provides a system and method for determining wellness or impending fault of contactors and motor starters that overcomes the aforementioned shortcomings. The invention uses various measurements of coil current, coil voltage, line current, or line voltage to determine performance indicators and fault predictors such as contact carrier over-travel, contact erosion, estimated remaining life, armature pull-in time, armature friction or jam, coil current differential, contact weld, coil temperature characteristics, and/or re-ignition during contactor switching. Current and voltage measurements are also used to provide accurate indications of the position of contacts.

Therefore, in accordance with one aspect of the present invention, a contactor having moveable contacts, stationary contacts, and an electromagnet to open and close the contacts also includes a coil current sensor, a line current sensor, and a controller. The coil current sensor is connected in a manner so as to output signals indicative of current flowing through the electromagnet during operation cycles thereof. Similarly, the line current sensor is attached so that it outputs signals indicative of current flowing through the contacts. The controller receives the signals from the sensors and determines a fault indicator therefrom.

According to another aspect of the present invention, a method for predicting contactor fault is disclosed. The method includes measuring current through a coil of an electromagnetic contactor and determining a contactor performance indicator therefrom. The contactor performance indicator is compared to a threshold value to predict contactor fault.

In accordance with a further aspect of the present invention, a switching apparatus is disclosed which includes a contactor and a relay. The contactor has a DC actuating coil and is connected to the relay. The relay receives inputs from the contactor and contains a circuit which is constructed to cause one or more of armature pull-in time, over-travel time, and coil current differential to be evaluated and to cause an indication of contactor fault likelihood to be generated, depending upon the outcome of the evaluation.

According to yet another aspect of the present invention, a method for manufacturing a contactor wellness monitor is disclosed. The method includes providing a contactor which has an electromagnetic actuating coil, arranging electrical components so that signals indicating coil current are acquired, and establishing a number of electrical connections to conduct the signals toward a processing unit. The method also includes programming the processing unit such that it monitors coil current during operations of the contactor and generates a contactor wellness indicator by, in part, determining armature pull-in time, coil current differential, or both from the coil current signals.

Various other aspects, features, and advantages of the present invention will be made apparent from the following detailed description and the drawings.

BRIEF DESCRIPTION OF THE DRAWINGS

The drawings illustrate one preferred embodiment presently contemplated for carrying out the invention.

DETAILED DESCRIPTION OF THE PREFERRED EMBODIMENT

The present invention relates generally to electrical switching devices, and more particularly, to a method and apparatus for monitoring the wellness of contactors and motor starters, especially electromagnetic contactors and motor starters. The present invention measures various currents and voltages in one or both of the switched line and the coil of electromagnetic switching devices to monitor performance and determine indications of impending faults or existing faults of the device.

Figure 1:
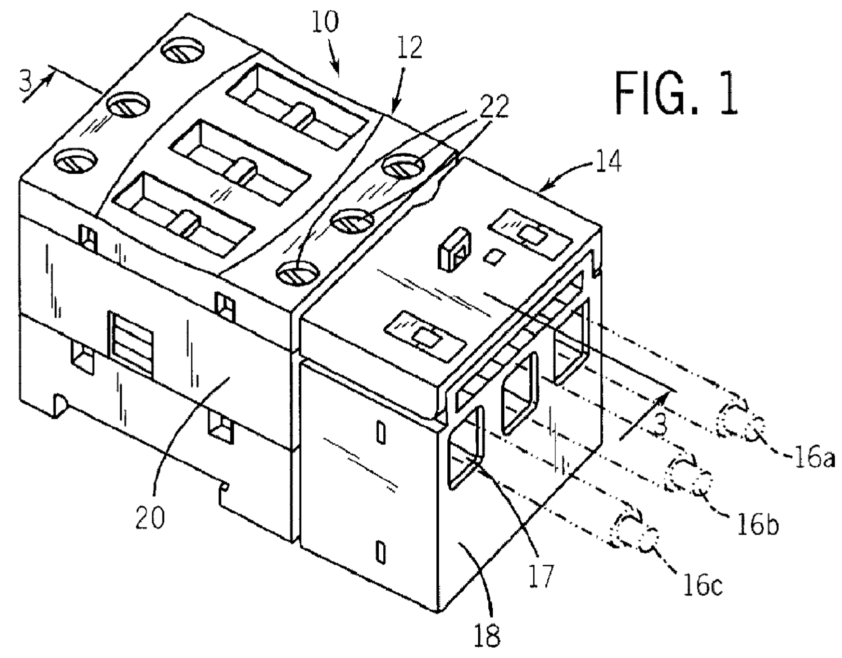
FIG. 1 is a perspective view of a contactor/motor starter in accordance with the present invention.

Referring to FIG. 1, the present invention will initially be described in reference to a contactor/motor starter 10, shown in perspective view. However, the present invention can also be implemented into multiple types of starters, other preexisting motor starter units, electronic overload relay units, or contactors. Further, it is appreciated that the wellness monitoring aspects of the present invention are not limited to contactors, motor starters, or to the particular type of electromagnetic contactor 12 or relay unit 14 shown in the figures. The present invention finds equivalent utility with other contactor types in other applications, such as, for example, unitary contactors, modular contactors, independently controllable contactors, contactors designed to switch other than three-phase inputs, and contactors having other arrangements of contacts, biasing mechanisms, and armatures.

In the embodiment depicted, motor starter 10 is a multiphase motor starter as commonly used in industrial control applications, such as motor control. Motor starter 10 includes a contactor 12 and an overload relay 14. Contactor 12 is an electromagnetic contactor for switching supply current to a load (not shown). Overload relay 14 senses and measures the current to the load, and shuts off or de-energizes contactor 12 if too much current (overload) is flowing to the load, thus protecting the load. Overload relay 14 is shown connected with the contactor 12 at one end and accepts a series of conductors 16*a*, 16*b*, and 16*c* (shown in phantom) at another end through overload relay housing 18. Conductors 16*a*, 16*b*, and 16*c* extend through overload relay 14 and into contactor housing 20 and are secured by lugs 22. It is appreciated, however, that other embodiments of motor starter 10, contactor 12, and/or relay 14 may switch more or fewer lines, and thus may accept more or fewer conductors 16.

Figure 2:
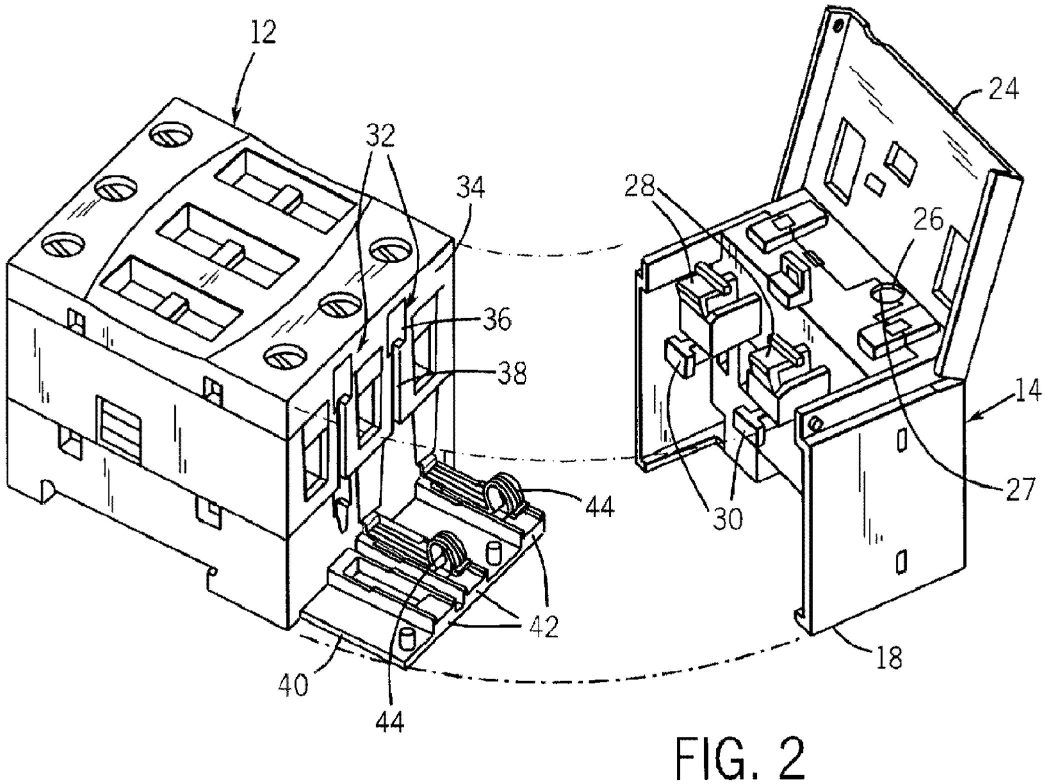
FIG. 2 is a perspective view of the contactor/motor starter of FIG. 1 with the contactor and overload relay separated.

Referring to FIG. 2, overload relay 14 and contactor 12 are shown in separation, and cover 24 of overload relay 14 is shown in a cover open position. Overload relay housing 18 includes a circular opening 26 through which the rotary knob of a potentiometer 27 connected to a printed circuit board (not shown) is disposed. Potentiometer 27 includes a screwdriver type slot for adjustment of the full load amperage of the particular motor with which the motor starter 10 is to be used.

In a preferred embodiment, the physical connection between overload relay 14 and contactor 12 is made with flexing lock tabs 28, which are each connected to a T-shaped retaining projection 30. Retainer projections 30 are insertable into connecting slots 32 within housing wall 34 of contactor 12. Receiving channels 36 of connecting slots 32 terminate in a retaining channel 38 which is narrower than the receiving channel 36 so as to prevent removal of a retaining projection 30 inserted into receiving channel 36 and slid downwardly into retaining channel 38. When a retainer projection 30 has been slid down into retaining channel 38, flexing lock tabs 28 will snap into connecting slots 32 of housing wall 34.

Contactor 12 includes a platform 40 which is integral with and extends substantially transversely to the plane of contactor wall 34. Platform 40 includes supports 42 for supporting flexible coil terminals 44 which extend outwardly from within the contactor 12. When coupled with contactor 12, the overload relay 14 is placed over the platform 40 to make an electrical connection with flexible coil terminals 44. In the embodiment shown, each coil terminal 44 is comprised of three separate conductive leads, while other similar embodiments utilize a number of separate coil terminals per phase connection. In an alternative implementation, each phase connection may have one coil terminal 44 with one conductive lead. Electrical connections may also be integrated with lock tabs 28 or retaining projection 30. In addition, while only two terminals 44 are shown, it is contemplated that other numbers and arrangements of terminals may be utilized. Contactor 12 may include a terminal 44 corresponding to each switched line or may include a number of terminals 44 for monitoring and controlling fewer than all switched lines of the contactor 12. Thus, a variety of electrical connections between contactor 12 and overload relay 14 can be achieved are known.

Figure 3:
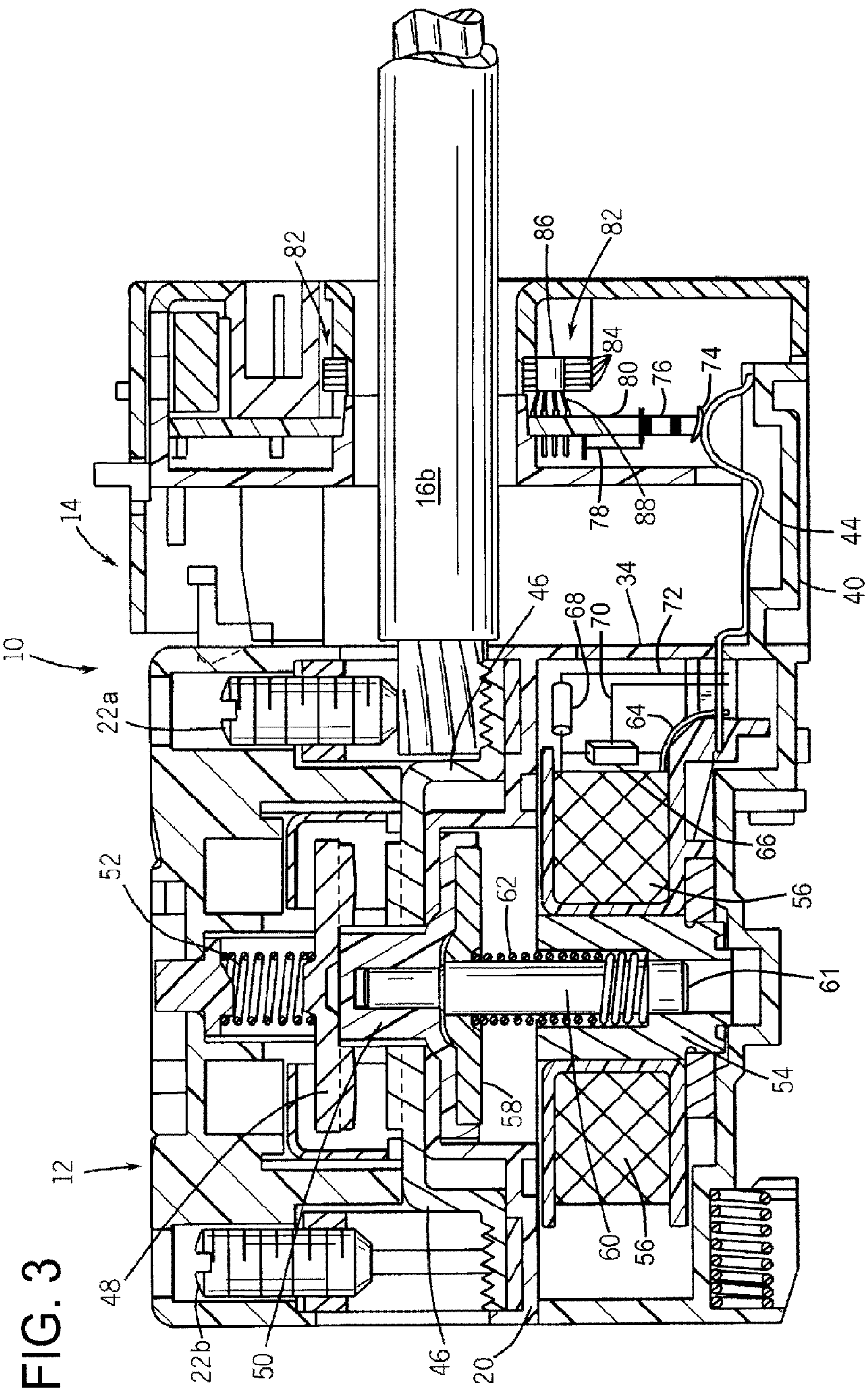
FIG. 3 is a cross-sectional view of the contactor/motor starter of FIG. 1 taken along line 3-3 of FIG. 1.

Referring to FIG. 3, a cross sectional view of motor starter 10 taken along line 3-3 of FIG. 1 is shown. Motor starter 10 is depicted in its coupled position wherein contactor 12 and overload relay unit 14 are physically and electrically engaged. One lug 22*a* of contactor 12 is shown securing conductor 16*b* to a stationary contact 46 on the load side of contactor 12. The other lug 22*b* is shown in an unfastened position on the line side of contactor 12. In the embodiment shown, one of the contact assemblies of contactor 12 includes a pair of stationary contacts 46 mounted to the contactor housing 20. A pair of moveable contacts 48 is mounted to a moveable contact carrier 50. The moveable contacts 48 are biased toward the stationary contacts 46 by a moveable contact biasing mechanism 52.

A magnetic core 54 surrounded by an electromagnetic coil 56 in a conventional manner is located on a base portion of contactor housing 20. In other embodiments, core 54 and coil 56 may be positioned above contacts 46, 48. Magnetic core 54 is preferably a solid iron member and electromagnetic coil 56 is preferably configured to operate on direct current (DC). It is appreciated, however, that the wellness monitoring aspects of the present invention are also applicable to AC actuating coils, albeit via modified calculations. When energized, magnetic core 54 attracts a magnetic portion or armature 58 of moveable contact carrier 50. Moveable contact carrier 50, along with magnetic armature 58, is guided towards the magnetic core 54 along guide pin 60.

Guide pin 60 is press-fit or molded securely into moveable contact carrier 50 at one end and is slidable along an inner surface of magnetic core 54. The single guide pin 60 is centrally disposed and is utilized in providing a smooth and even path for the armature 58 and moveable contact carrier 50 as they travel to and from the magnetic core 54. Preferably, guide pin 60 and inner surface of magnetic core 54 are manufactured so as to limit friction therebetween. Friction during movement of guide pin 60 and carrier 50 can be a major limiting factor on the useable life of a contactor. Guide pin 60 is partially enclosed by a resilient armature return spring 62, which is compressed as the moveable contact carrier 50 moves toward the magnetic core 54. Armature return spring 62 biases the moveable contact carrier 50 and the armature 58 away from magnetic core 54. Additionally, a bottom portion 61 of guide pin 60 may be used to dampen the end of its downward movement to help reduce bounce and cushion the closure of the armature 58 with magnetic core 54.

Preferably, guide pin 60, carrier 50, armature 58, and moveable contacts 48 are configured to allow carrier over-travel. In other words, when moveable contacts 48 fully engage stationary contacts 46, guide pin 60, carrier 50, and armature 58 can continue downward movement a certain distance known as an over-travel. This is achieved by integrating a resilience or flexibility in the connection between moveable contacts 48 and carrier 50. Thus, an increased pressure on the engagement between moveable contacts 48 and stationary contacts 46 is achieved. The time during which guide pin 60, carrier 50, and armature 58 continue downward movement after contact engagement is commonly known as the over-travel time. Contact carrier over-travel distance can be measured by determining the over-travel time. A number of factors can cause over-travel and over-travel time to decrease, such as contact surface wear or erosion, or carrier jam. Once over-travel has decreased to a certain point, the total pressure maintaining engagement of the contacts can reach unacceptable levels, potentially causing contactor failure. Therefore, over-travel time can be an effective indicator of the wellness or remaining useable life of a contactor.

An operation cycle of contactor 12 begins at a contacts open position in which moveable contacts 48 are not in engagement with stationary contacts 46 and no line or phase current is flowing therethrough. A closing operation commences when coil 56 is energized by a DC control voltage causing magnetic core 54 to attract magnetic armature 58 of contact carrier 50. The downward attraction of armature 58 causes carrier 50 and pin 60 to overcome the bias of armature return spring 62. One of the phases of a three phase line current will begin to flow through conductor 16*b* when moveable contacts 48 first touch stationary contacts 46. Preferably, as described above, contact carrier 50, armature 58, and guide pin 60 will continue to move downward after contacts 46 and 48 have fully engaged until the armature 58 seals against the upper surface of core 54, stopping movement. The over-travel of carrier 50 increases contact engagement pressure to better hold moveable contacts 48 and stationary contacts 46 together.

An opening operation commences when the DC control voltage applied to coil 56 is turned off. Current through coil 56 dissipates, and magnetic core 58 ceases to attract armature 58 strongly enough to overcome the bias of armature return spring 62 as well as the contact force springs 52. Thus, carrier 50, armature 58, and guide pin 60 begin upward movement, and are joined by moveable contacts 48 after the over-travel distance. After moveable contacts 48 and stationary contacts 46 are no longer engaged, line current through conductor 16*b* will be interrupted. That is, current will flow between moveable contacts 48 and stationary contacts 46 for a very brief time after disengagement due to arcing, but will cease once the arc extinguishes. The bias of spring 62 causes contactor 12 to return to the contacts open position.

In regard to the electrical connection between contactor 12 and overload relay 14, a primary coil connector 64 extends from electromagnetic coil 56 and is electrically connected to coil terminal 44. Coil connector 64 conducts the DC control voltage and current for operating electromagnetic coil 56 from overload relay 14 via terminal 44. In embodiments of the invention in which voltage and current sensing are performed in contactor 12, a current sensor or shunt 68 is included in series with coil 56 and a voltage sensing device or circuit 66 is included in parallel with coil 56. A wire 72 is attached at one end of shunt 68 so that the voltage drop thereacross (as a measure of current flow) can be ascertained. Voltage device 66 has a wire 70 which conducts a measure of the voltage across coil 56. Embodiments in which sensing takes place in the contactor can operate with one or both of shunt 68 and voltage device 66. Thus, in such an embodiment, coil terminal 44 may include two or three leads (not shown) for electrical connection with relay 14—a DC control voltage/current input lead and either or both of a voltage measurement 70 lead and a shunt measurement 72 lead.

In other embodiments, it may be desirable to perform coil current and voltage sensing within overload relay 14. Printed circuit board (PCB) 80 relays power to terminal 44 via a connection 74 therewith. A shunt 76 is inserted between connection 74 and PCB 80, and feedback wire 78 is used to provide a signal indicating the voltage drop across shunt 76 so that current flowing from PCB 80 (and thus current flowing into coil 56) can be measured. Alternatively, shunt 76 may be replaced by a current sensing device capable of directly providing a digital indication of current flow therethrough. It is to be understood that shunt 76 and feedback wire 78 may be implemented as an alternative to shunt 68. For voltage sensing to take place in relay 14, PCB 80 may have voltage sensing circuitry integrated therein to monitor the voltage output to connection 74 and coil 56, rather than using voltage device 66.

Overload relay 14 also contains a magnetic flux concentrating shield 82, made of thin layers of laminated members 84 secured or stamped together. Shield 82 is positioned about the opening through which conductor 16*b* is inserted. In combination with a magnetic field sensor, such as a Hall Effect sensor 86, flux concentrating shield 82 is used to monitor current flow through conductor 16*b*. Hall Effect sensor 86 is connected to PCB 80 via leads 88 so that it is positioned over shield 82. Alternatively, other sensors, circuits, or components for monitoring current through conductor 16*b* may be incorporated so that indications of starts and stops of current flow, as well as the timing thereof, may be used in wellness monitoring, determinations, and calculations. Various well-known alternatives or equivalents (not shown) for measuring the voltage across contacts 46, 48 may be incorporated in lieu of, or in combination with, Hall sensor 86. Such alternatives and equivalents may include voltage detectors or solid state voltage sensors integrated into contactor 12, relay 14, or the three-phase power source (not shown) supplying power.

Figure 4:
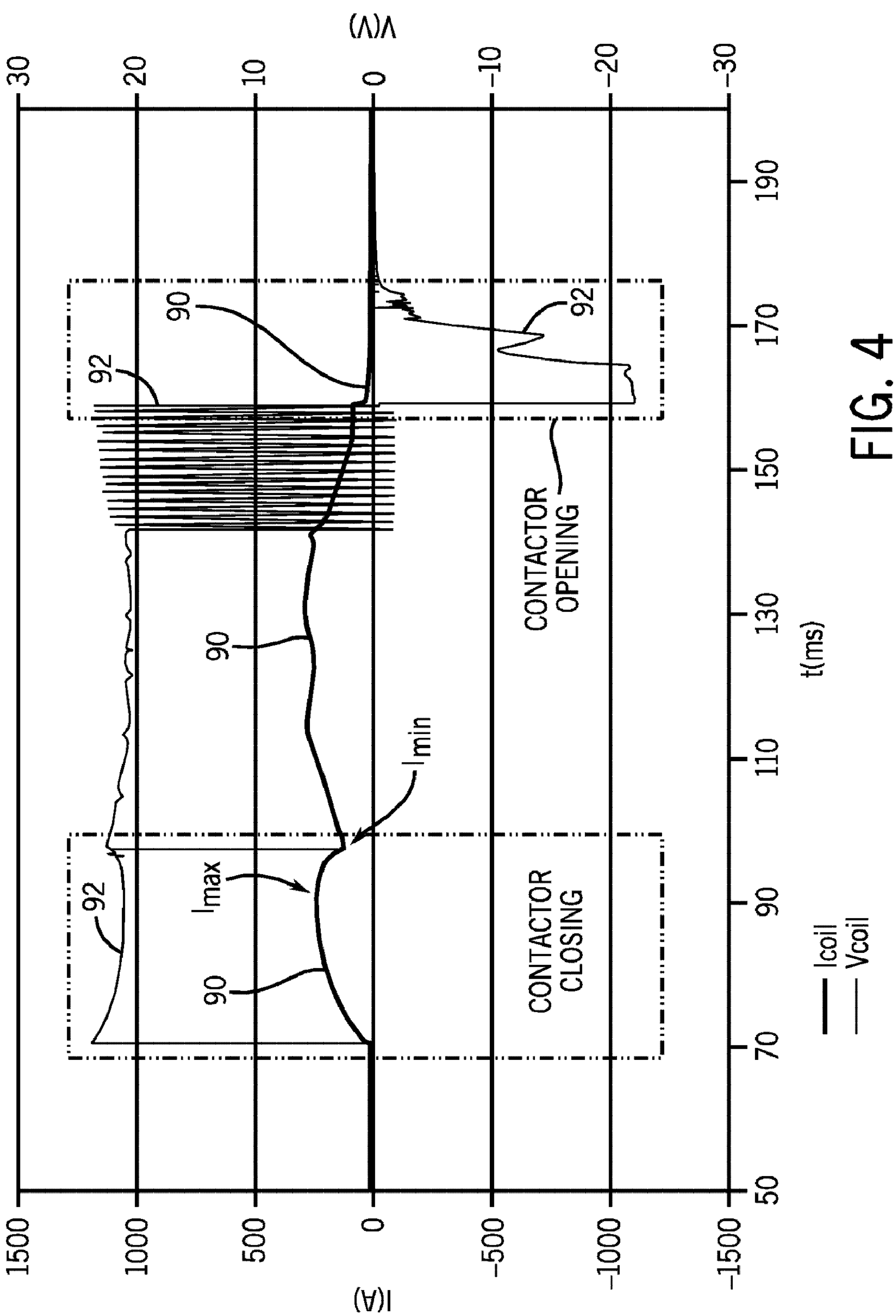
FIG. 4 is a graph showing voltage and current characteristics within an actuating coil associated with the present invention.

Referring now to FIG. 4, the current 90 and voltage 92 characteristics of a contactor through a complete open and close cycle are shown. Description of the operation and characteristics of contactor 12 will be described as shown in FIG. 4 with reference to the physical components shown in FIG. 3. Once coil 56 is energized for a closing operation, voltage 92 increases to a maximum while current 90 increases more slowly. Until carrier 50 begins downward movement, the current through coil 56 will increase to a "closing maximum" value $I_{max}$. After contact carrier 50, armature 58, and guide pin 60 begin to slide downward, the back EMF experienced by the coil 56 will oppose the DC control voltage applied thereto, forcing current through coil 56 to begin decreasing from the closing maximum value. After contact carrier 50 ceases its over-travel, the current through coil 56 will be at a "closing minimum" value $I_{min}$, from which current will begin to increase again.

Figure 5:
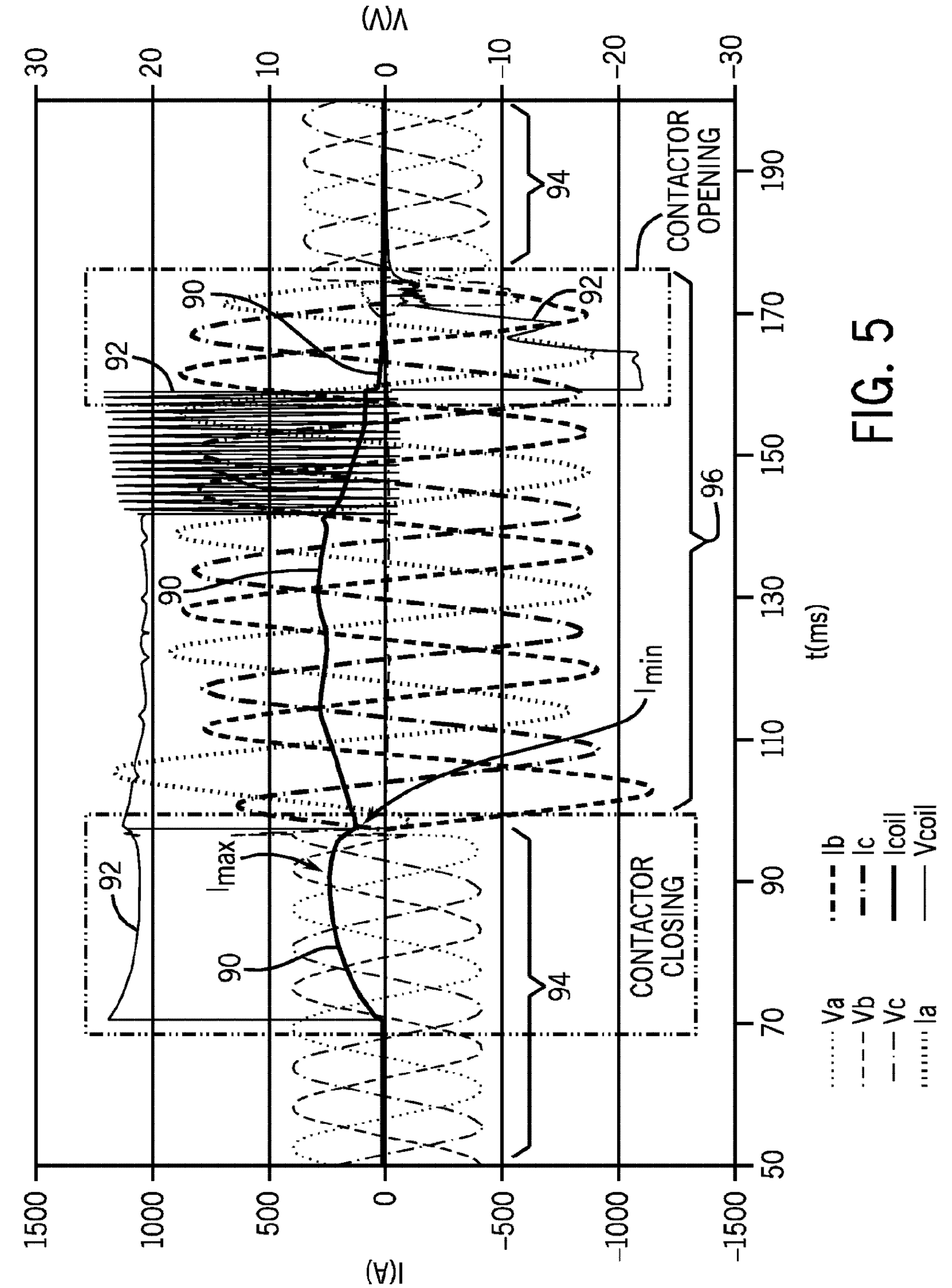
FIG. 5 is a graph showing the voltage and current characteristics of FIG. 4 with voltage and current characteristics of a three-phase input power overlaid therewith.

FIG. 5 shows the current 90 and voltage 92 characteristics from FIG. 4, with three-phase voltage 94 and three-phase current 96 responses overlaid thereon. As can be seen, a three-phase voltage 94 can be measured across contacts 46 (i.e. across the line side terminal and the load side terminal) before the contacts 46, 48 engage, and after the contacts 46, 48 have opened. Correspondingly, a three-phase current 96 flows through the contacts 46, 48 and conductor 16*b* when contacts 46, 48 are closed/engaged. A three-phase voltage 94 across contacts 46 can no longer be measured beginning just prior to $I_{min}$, approximately whereupon three-phase current 96 begins. The point during a closing operation at which three-phase voltage 94 ceases to be measured and three-phase current 96 begins is a positive indication of contact closure. Similarly, during the transient response of coil voltage 92, coil current returns to a zero or minimum value and contacts 46, 48 disengage. The disengagement of contacts 46, 48 is positively indicated when a three-phase voltage 94 is again measurable across contacts 46 and three-phase current 96 ceases to flow therethrough.

Figure 6:
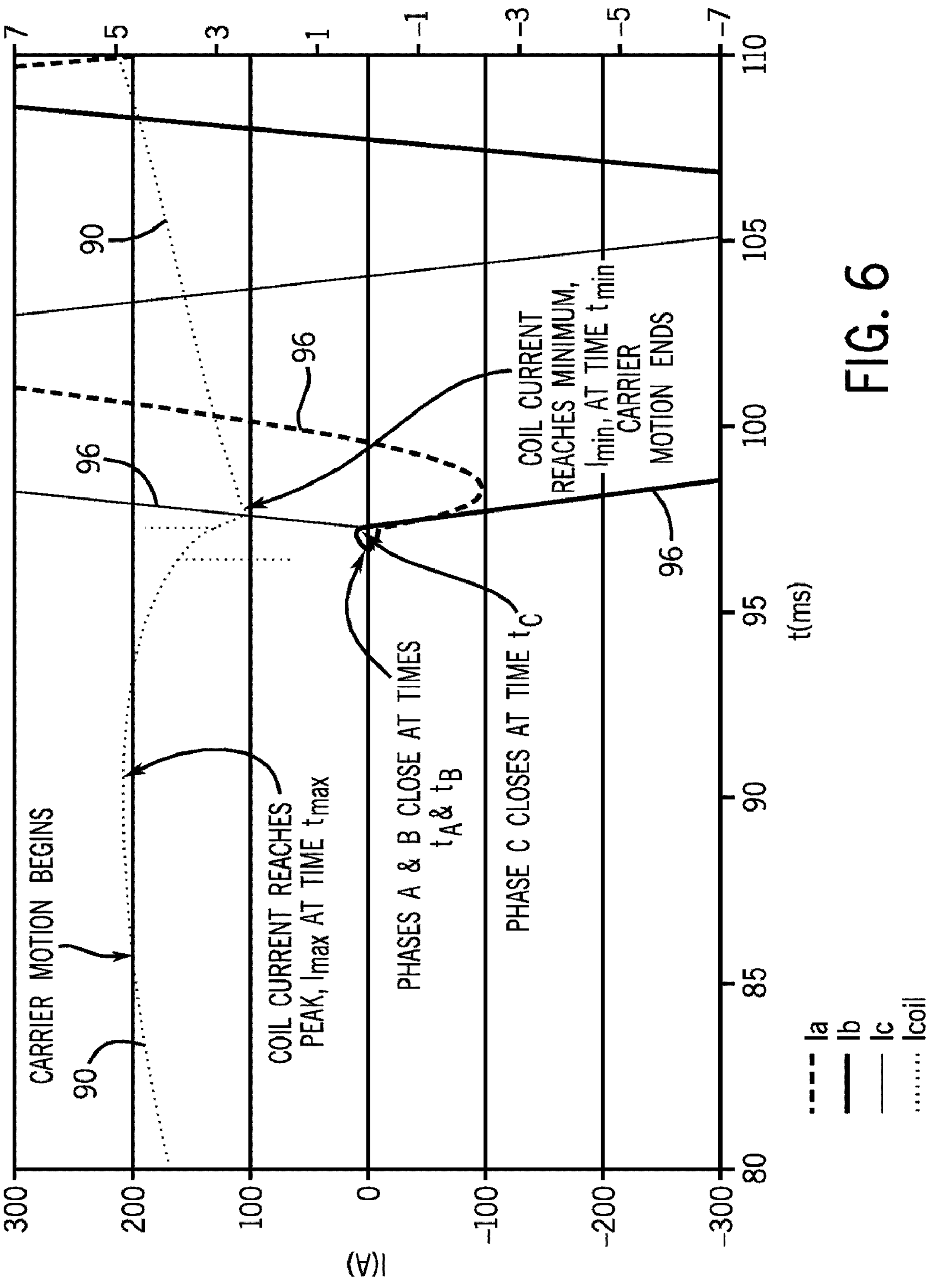
FIG. 6 is a graph showing a detailed portion of FIG. 5.

Referring now to FIG. 6, a detailed view of the voltage and current characteristics of a contact closure is shown. Upon coil energization for a contact closing operation, coil current 90 increases towards a peak value $I_{max}$ at time $t_{max}$. The time $t_{max}$ at which the coil current reaches its peak $I_{max}$ may be taken to be an indication of the commencement of downward contact carrier motion, though carrier motion may begin slightly before this time. Once the contact carrier overcomes the bias of the armature return spring and begins downward motion, coil current 90 begins to decrease. At times $t_a$, $t_b$, and $t_c$, three-phase current 96 begins to flow, indicating that contacts 46, 48 have engaged. At a point subsequent to $t_a$, $t_b$, and $t_c$, coil current 90 reaches a minimum value $I_{min}$ at time $t_{min}$. Time $t_{min}$ may be taken to be an accurate indication of the time at which contact carrier over-travel has ceased.

As can be seen in FIG. 6, from the non-simultaneous begin-times of the three-phase current $t_a$, $t_b$, and $t_c$, the contacts for each phase of a three-phase contactor do not always close at exactly the same time, even in "synchronously" operating contactors. This phenomenon can be caused by a variety of factors, including uneven thickness of contacts, imbalance or slant of the contact carrier due to contactor mounting position, uneven wear or erosion of contacts, or for other reasons. This is expected in real world contactors.

False indications of current starting or stopping time can also occur due to the complexity in current rise and fall rates and variations in transience. False indications of current starting time can make it appear that contacts have strong erosion or contactors are close to failure. These false indications generally do not occur for each operation of a contactor, however. Thus monitoring through a number of operations can allow a user to average timing data, create trend lines, or to disregard statistically inconsistent or ignorable data, such as extreme outliers. Such practices are effective at eliminating the effects of false indications of openings or closings of contacts 46, 48.

Figure 7:
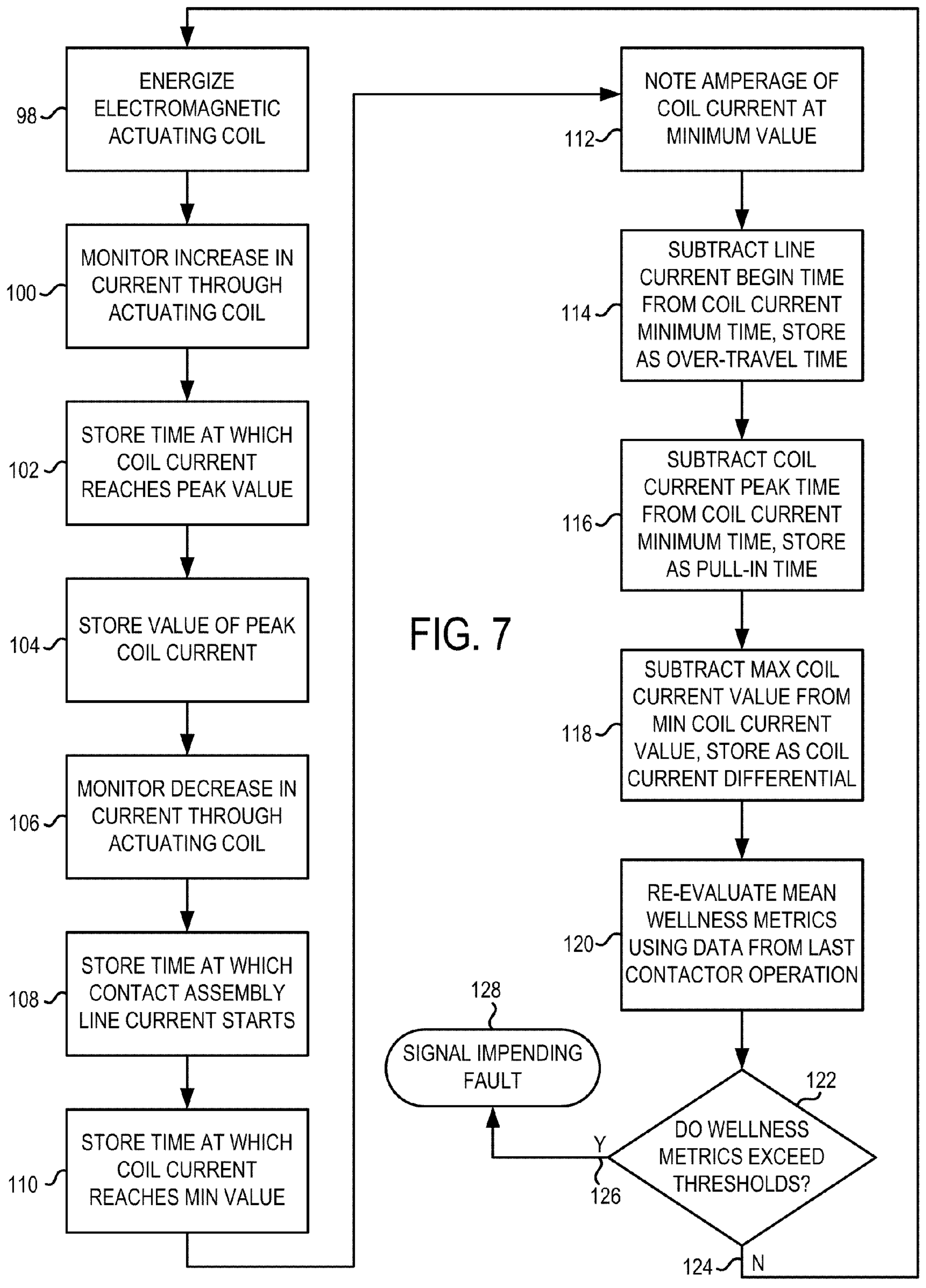
FIG. 7 is a flow chart in accordance with the present invention.

FIG. 7 is a flow chart showing one implementation of the present invention for monitoring wellness. The technique begins when a contactor coil is energized 98 with a DC voltage to begin a closing operation. The increase in coil current 100 is then monitored. When the coil current reaches its peak value, the time $t_{max}$ is stored 102 along with the value or amperage of the peak coil current 104. Thereafter, the system monitors the decrease in coil current 106 as the carrier and moveable contacts approach the stationary contacts. When the contacts for a phase engage, current will begin to flow therethrough, and the start time of this current is stored 108. Preferably, a separate current begin time $t_a$, $t_b$, $t_c$ is determined 108 for each phase of the three phase input signal. When coil current reaches a minimum value $I_{min}$ both the amperage 112 and time $t_{min}$ 110 of the minimum are stored.

Next, a processing unit of the overload relay or of another external device subtracts the phase current begin time $t_a$, $t_b$, $t_c$ from the coil current minimum time $t_{min}$ to determine contact carrier over-travel time 114. The coil current peak time $t_{max}$ may also be subtracted from the coil current minimum time $t_{min}$ to determine armature pull-in time 116. Optionally, armature pull-in time may be averaged and included in a calculation to determine mean carrier closing speed as an indication of carrier/armature/guide pin friction. The system may also subtract the peak coil current value $I_{max}$ from the minimum coil current value $I_{min}$ to determine a coil current differential 118. Over-travel time, armature pull-in time, and coil current differential are metrics by which the wellness, or remaining usable life, of the contactor can be determined as well as existing faults These wellness metrics 114, 116, 118 may then be averaged over a chosen number of contactor cycles 120. The longer the period chosen to average values, the less will be the impact of false start or stop indications. However, a longer averaging period can also lead to decreased precision if only averaged values are compared to thresholds. Therefore, a user should select an appropriate averaging period based upon the type of contactor used and the desired precision.

Most contactors and motor starters have manufacturer test data indicating over-travel, over-travel time, armature pull-in, and/or coil current differential thresholds. These thresholds can be absolute values or can represent percentage decreases from new contactor parameters. Once these thresholds are reached, it can reasonably be expected that a fault is imminent. Tested threshold data usually varies by contactor type, use, and model. Therefore, a controller, such as the overload relay or another external device, may be programmed to store the threshold over-travel time, armature pull-in time, and/or coil current differential value for the contactor in use. These thresholds are compared with the determined actual over-travel times, armature pull-in times, and/or coil current differential values, averaged values, or trends 122. If the wellness metric value (or values) being compared exceeds the corresponding threshold 126, a signal or indication of impending or existing fault is issued 128. When a measured coil current differential does not fall within the coil current differential threshold, it is likely that a fault such as contact weld or carrier jam has already occurred. When a measured over-travel time or pull-in time is not within the corresponding threshold, a fault is likely to occur. The indication of impending or existing fault may take the form of a warning light or alarm, a user alert, or an automatic shutdown for contactor replacement. If the wellness metric (or metrics) does not exceed the corresponding threshold 124, then the contactor is permitted to continue operation cycles. The monitoring described above may take place for each operation or cycle of a contactor, after a given number of cycles, or upon a set timing period.

Contact carrier over-travel time 114 may be used as a direct indication of contact remaining life or of the extent of contact surface erosion. Essentially, over-travel time is a parameter that measures the contact force spring compression after contacts engage. As contact surfaces erode, the over-travel distance decreases, resulting in the after-engagement compression force decreasing. The contactor will fail when the total contact force, including magnetic attraction and after-engagement compression, falls below a certain limit. Therefore, contactor remaining life, or "wellness," has a roughly proportional relationship to over-travel time.

In practice, variations will exist in the detected carrier over-travel times, due in part to variations in detection of current start times. Thus, averages over multiple cycles to establish trend lines for a contactor can be very beneficial in predicting impending faults and future extent of wear and erosion, etc. In general, a threshold over-travel time value can reliably be set at about 70% of new contactor over-travel time for determining potential contactor failure, as measured against a decreasing actual over-travel time. As stated above, however, the most appropriate threshold values may vary by contactor and application. Also, since contact erosion and mass loss can occur unequally in the movable contacts or the stationary contacts, and can vary among the contacts for each phase, measuring the over-travel time for all phases is preferable.

Contact carrier (or armature) pull-in time 116 may be used as an indication that the speed of the carrier, armature, and guide pin during a closing or opening operation is decreased or that the carrier, armature, and/or guide pin are experiencing too much friction. Friction in the contact motion can result simply from wear between the magnetic core and guide pin or between the contact carrier and contactor housing. In other instances, friction can be due to the accumulation of debris generated by contact erosion or arcing. Over the course of many operations, a contactor will inevitably wear, regardless of the cause, and the armature pull-in time will increase. Pull-in times of a contactor will generally increase more drastically the closer a contactor gets to a failure point, after which time contacts cease to close or open altogether. While pull-in times may be compared to threshold values as discussed above, another more relative method for using pull-in times to predict failure incorporates the use of means and/or trend lines. Contactors will experience quite noticeable increases in pull-in time (by factors of almost 100%) just prior to failure. Thus, a trend line indicating a sudden jump in pull-in time can positively predict impending failure.

Coil current differential 118 can be used as an indication of carrier jam or contact weld. That is, as a contactor approaches failure, coil current differential can decrease by as much as 40% or more. Decreased coil current differential (i.e. a decrease in the range of coil current values during operation) indicates either that the carrier and armature are not fully returning to a contacts open position and/or that the contacts are welding. As coil current differential decreases appreciably from the new contactor value, a failure becomes more and more imminent. Thus, coil current differential may be used as an indicator for carrier jam or contact weld.

Conversely, detected coil current differentials within acceptable ranges can be assumed to mean that contacts are opening and closing properly, independently of the detection of line currents and voltages. Similarly, issues relating to coil temperature, such as contactor overheating, are also evidenced by changes in coil current differential values. Detecting normal coil current peaks, minimums, and differentials therebetween can indicate that the coil is operating under normal temperature conditions and sensitivities. Thus, coil current differential measurements may be used in a variety of ways to monitor coil temperature characteristics.

As seen in FIGS. 4 and 5, the voltage characteristics 92 of the DC coil control voltage also exhibits measurable changes corresponding to movement of the contact carrier and contact closings 96 and openings 94. Therefore, in a manner similar to the coil current monitoring embodiment of FIG. 7, and as described above, the present invention may be adapted to determine wellness metrics and predict failures from coil voltage and/or line voltage rather than (or in addition to) coil current and/or line current.

Other applications of the wellness monitor of the present invention can operate as mirror contacts or instead of mirror contacts, can provide real time updating of contactor on and off timings to optimize the performance of Point on Wave control, and can detect re-ignition during contactor switching. That is, due to the ability of the present invention to monitor line current and voltage start and stop times and contact closing and opening start and stop times, positive indications of contact closure and full opening and closing cycles can be achieved for increased control and to monitor for system problems not necessarily caused by wear of the contactor.

In particular, the present invention finds application in augmentation or replacement of safety interlocks or mirror contacts. By not relying upon mechanical implementations for determining contact closure and opening, the present invention avoids many of the problems associated with mirror contacts. Therefore, an indication of contact closure derived from coil current, such as from an indication of the cessation of carrier movement (coil current minimum) after a full range of motion (coil current differential), can be used to gate or interlock the commencement of line current. The gating or interlocking of the commencement of three-phase current flow may be performed by external components as known in the art.

In addition, the present invention has been described thus far with particular reference to one embodiment of a particular contactor type with an overload relay attached thereto. However, it is appreciated and contemplated that the present invention may be embodied in many contactor embodiments in other applications, such as a contactor which does not include an attached relay. Likewise, the present invention may be embodied in contactors of configurations and types other than that discussed herein.

Moreover, reference has been made to multiple parameters, predictors, and indicators for determining contactor wellness. For example, contact over-travel, armature pull-in time, and coil current differential are discussed as useful for estimating future faults or remaining useful life, etc. However, it should be recognized that no single one of these parameters individually is necessary to predict wellness, that all are inter-compatible in determining wellness, and that other components, parameters, predictors, and indicators not explicitly mentioned herein may also be used in conjunction with the present system and method.

Therefore, a contactor embodying the invention includes a pair of moveable contacts, a pair of stationary contacts, and an electromagnet arranged to switch the contacts between open and closed positions. A coil current sensor is included to output signals indicative of electromagnet current during operation and a line current sensor is included to output signals indicative of current through the contacts. A controller is connected to receive these signals and determine a fault indicator therefrom.

A method for predicting contactor faults is also presented. The method includes the steps of measuring line current, measuring coil current, and determining a contactor performance indicator from one or both measured currents. The performance indicator is compared to a threshold value in order to predict imminence of a fault.

In addition, a switching apparatus is disclosed, which includes a contactor, having a DC actuating coil, connected to a relay. The relay controls operation of the contactor and contains a circuit which receives inputs from the contactor and causes at least one of armature pull-in time, over-travel time, and coil current differential to be evaluated. The circuit then causes an indication of contactor fault likelihood to be generated, based upon the outcome of the evaluation.

The present invention also encompasses a method for manufacturing a contactor wellness monitor. The method includes providing a contactor having an electromagnetic coil, arranging electrical components to acquire coil current signals, and establishing electrical connections to conduct the signals toward a processing unit. The processing unit is programmed to monitor coil current, determine one or both of armature pull-in time and coil current differential, and generate a contactor wellness predictor.

As such, the present invention has been described in terms of the preferred embodiment, and it is recognized that equivalents, alternatives, and modifications, aside from those expressly stated, are possible and within the scope of the appending claims.

What is claimed is:

1. A contactor comprising:

at least one pair of moveable contacts;

at least one pair of stationary contacts;

an electromagnet arranged to cause the at least one pair of moveable contacts to travel to a contacts open position and a contacts closed position with respect to the at least one pair of stationary contacts;

a coil current sensor connected to output signals indicative of current through the electromagnet during operation cycles of the electromagnet; and a controller connected to receive the signals from the coil current sensor and programmed to determine a fault indicator therefrom.

2. The contactor of claim 1 wherein the fault indicator comprises at least one of a fault prediction and a fault detection.

3. The contactor of claim 1 further comprising a coil voltage sensor connected to output signals indicative of voltage across the electromagnet during operation cycles of the electromagnet.

4. The contactor of claim 1 further comprising a line voltage sensor connected to output signals indicative of voltage across the contacts when the contacts are in the contact open position.

5. The contactor of claim 1 wherein the fault indicator includes at least one of contactor remaining life, extent of erosion, armature pull-in speed, armature friction, armature jam, contact weld, or coil temperature characteristics.

6. The contactor of claim 1 wherein the controller is further programmed to generate an alert when the fault indicator reaches a threshold value.

7. The contactor of claim 1 wherein the controller is further programmed to average the fault indicator over a number of cycles of the electromagnet.

8. The contactor of claim 1 further comprising an interlock designed to:

determine proper engagement of the at least one pair of moveable contacts with the at least one pair of stationary contacts from the signals indicative of current through the electromagnet; and gate line current commencement thereto.

9. The contactor of claim 1 further comprising a line current sensor attached to output signals indicative of current through the contacts when the contacts are in the contact closed position.

10. The contactor of claim 9 wherein the controller is further programmed to determine a coil current peak, a coil current minimum, and a line current begin time for at least one cycle of the electromagnet.

11. The contactor of claim 10 wherein the controller is further programmed to perform at least one of:

determining armature pull-in time from a difference between a time at which the coil current peak occurred and a time at which the coil current minimum occurred;

determining over-travel from a difference between the time at which the coil current minimum occurred and the line current begin time; or determining a coil current differential from a difference between the coil current peak and the coil current minimum.

12. The contactor of claim 1 wherein the controller is disposed in a relay connected to the contactor.

13. A method for predicting contactor fault comprising:

measuring current through a coil of an electromagnetic contactor;

determining a contactor performance indicator from at least the coil current; and electronically predicting contactor fault in a controller from a comparison of the performance indicator and a threshold value.

14. The method of claim 13 further comprising determining a positive indication of contact closure from values of the coil current.

15. The method of claim 13 further comprising averaging the performance indicator over a number of operations of the contactor.

16. The method of claim 13 wherein the contactor performance indicator includes at least one of armature pull-in time, carrier over-travel time, or coil current differential.

17. The method of claim 13 further comprising measuring line current through the electromagnetic contactor.

18. The method of claim 17 further comprising determining a coil current peak time, a coil current minimum time, and a line current begin time for at least one operation of the contactor.

19. The method of claim 18 wherein determining a contactor performance indicator includes determining armature pull-in time from a difference between the coil current peak time and the coil current minimum time.

20. The method of claim 18 wherein determining a contactor performance indicator includes determining carrier over-travel time from a difference between the coil current minimum time and the line current begin time.

21. The method of claim 18 wherein determining a contactor performance indicator includes determining a difference between a coil current value at the coil current peak time and a coil current value at the coil minimum time.

22. The method of claim 13 further comprising generating a maintenance alert when the performance indicator is not within the threshold value.

23. The method of claim 13 further comprising measuring at least one of voltage across the coil of the electromagnetic contactor or voltage across contacts of the electromagnetic contactor.

24. The method of claim 13 further comprising detecting contactor fault from a comparison of the performance indicator and a threshold value.

25. A switching apparatus comprising:

a contactor having a DC actuating coil;

a relay connected to control the contactor and receive inputs therefrom; and wherein the relay contains a circuit which, upon receipt of the inputs from the contactor, is constructed to:

cause an evaluation to be performed of at least one of armature pull-in time, over-travel time, and coil current differential from the inputs; and cause an indication of contactor fault likelihood to be generated based on an outcome of the evaluation.

26. The switching apparatus of claim 25 wherein the inputs include signals indicative of at least one of current through the coil, voltage across the coil, current through contacts of the contactor, and voltage across contacts of the contactor.

27. The switching apparatus of claim 25 wherein performance of the evaluation and generation of the indication are carried out by one of the relay circuit or an external processing device.

28. The switching apparatus of claim 25 further comprising:

a coil current sensor disposed adjacent to the coil to output a signal indicative of coil current for the relay; and a line current sensor disposed adjacent to a conductor of the contactor to output a signal indicative of current through a pair of contacts of the contactor.

29. The switching apparatus of claim 25 wherein the indication of contactor fault likelihood is generated from a comparison of the at least one of armature pull-in time, over-travel time, and coil current differential with a threshold value.

30. A method for manufacturing a contactor wellness monitor comprising:

providing a contactor having an electromagnetic actuating coil;

arranging electrical components for acquisition of signals indicating at least coil current;

establishing a number of electrical connections to conduct the signals toward a processing unit; and programming the processing unit to:

monitor coil current during operations of the contactor;

determine at least one of armature pull-in time and coil current differential; and generate an indicator of contactor wellness therefrom.

31. The method of claim 30 further comprising providing a relay containing the processing unit therein.

32. The method of claim 30 wherein the indicator of contactor wellness is one of a comparison of the armature pull-in time to a pull-in time threshold and a comparison of the coil current differential to a differential threshold.

33. The method of claim 30 further comprising programming the processing unit to determine armature pull-in time from a difference between a coil current peak time and a coil current minimum time.

34. The method of claim 30 further comprising programming the processing unit to determine coil current differential from a difference between a coil current peak value and a coil current minimum value.

35. The method of claim 30 further comprising programming the processing unit to interlock commencement of line current with a determination of proper contact closure.

36. The method of claim 30 further comprising arranging electrical components for acquisition of signals indicating line current through contacts of the contactor.

37. The method of claim 36 further comprising programming the processing unit to determine a contact carrier over-travel from a difference between a coil current minimum time and a contactor line current begin time.

38. The method of claim 37 wherein the indicator of contactor wellness is a comparison of the contact carrier over-travel to an over-travel threshold.

39. The method of claim 37 further comprising programming the processing unit to determine a trend for at least one of the armature pull-in time, the coil current differential, and the contact carrier over-travel over a number of operations of the contactor.

* * * * *